US008951815B2

(12) United States Patent
Murakami et al.

(10) Patent No.: US 8,951,815 B2
(45) Date of Patent: Feb. 10, 2015

(54) METHOD FOR PRODUCING LIQUID-DISCHARGE-HEAD SUBSTRATE

(75) Inventors: Ryotaro Murakami, Kawasaki (JP); Shuji Koyama, Kawasaki (JP); Keisuke Kishimoto, Yokohama (JP); Kenta Furusawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 77 days.

(21) Appl. No.: 13/526,958

(22) Filed: Jun. 19, 2012

(65) Prior Publication Data

US 2012/0329181 A1 Dec. 27, 2012

(30) Foreign Application Priority Data

Jun. 21, 2011 (JP) ................................ 2011-137731
May 16, 2012 (JP) ................................ 2012-112719

(51) Int. Cl.
*H01L 21/00* (2006.01)
*B41J 2/16* (2006.01)

(52) U.S. Cl.
CPC .............. *B41J 2/1603* (2013.01); *B41J 2/1629* (2013.01); *B41J 2/1634* (2013.01); *B41J 2/1639* (2013.01)
USPC ........................ 438/21; 347/65; 257/E21.238

(58) Field of Classification Search
CPC .......................... H01L 29/66007; H01L 29/66
USPC ........... 438/21; 257/E21.238; 216/27; 347/65
See application file for complete search history.

(56) References Cited

U.S. PATENT DOCUMENTS 6,126,276 A * 10/2000 Davis et al. .................... 347/65
2003/0081069 A1* 5/2003 Kim et al. ........................ 347/56
2004/0057589 A1* 3/2004 Pedersen et al. .............. 381/152
2007/0023389 A1* 2/2007 Hess .............................. 216/27
2008/0122899 A1* 5/2008 Lee et al. ........................ 347/65
2009/0266180 A1* 10/2009 Jiang et al. ............... 73/862.381

FOREIGN PATENT DOCUMENTS

JP 2011-51253 A 3/2011

* cited by examiner

*Primary Examiner* — Caridad Everhart
(74) *Attorney, Agent, or Firm* — Canon U.S.A. Inc., IP Division

(57) ABSTRACT

A method for producing a liquid-discharge-head substrate includes a step of preparing a silicon substrate including, at a front-surface side of the silicon substrate, an energy generating element; a step of forming a first etchant introduction hole on the front-surface side of the silicon substrate; a step of supplying a first etchant into the first etchant introduction hole formed on the front-surface side of the silicon substrate, and supplying a second etchant to a back-surface side of the silicon substrate; a step of stopping the supply of the second etchant; and a step of, after the supply of the second etchant has been stopped, forming a liquid supply port extending through front and back surfaces of the silicon substrate by the supply of the first etchant.

5 Claims, 3 Drawing Sheets

METHOD FOR PRODUCING LIQUID-DISCHARGE-HEAD SUBSTRATE

BACKGROUND OF THE INVENTION

1. Field of the Invention

The present invention relates to a method for producing a liquid-discharge-head substrate.

2. Description of the Related Art

In the production of a liquid-discharge-head substrate, a silicon substrate is etched to form a liquid supply port. A silicon substrate is etched at different rates depending on plane orientations with an alkaline aqueous solution such as an aqueous solution of tetramethyl ammonium hydroxide (TMAH). A silicon substrate is subjected to anisotropic etching utilizing the difference in etching rates according to plane orientations to form a liquid supply port.

To enhance the productivity, for example, Japanese Patent Laid-Open No. 2011-51253 describes a method in which an etchant is supplied to both surfaces of a silicon substrate to simultaneously etch these surfaces of the silicon substrate.

To enhance the productivity, a silicon substrate may be etched with an etchant that has a high etching rate for silicon substrates.

According to studies performed by the inventors of the present invention, when an etchant that has a high etching rate for silicon substrates is used in the method described in Japanese Patent Laid-Open No. 2011-51253, there are cases where a liquid supply port cannot be formed so as to have an accurate opening width in the front surface on which energy generating elements are formed. Specific explanations are as follows.

First, there are cases where a protective film for protecting energy generating elements and wiring on the front surface is etched with the etchant having a high etching rate. As a result, side etching in the silicon substrate becomes less likely to be controlled with the protective film and it sometimes becomes difficult to control the opening width of a liquid supply port.

Second, although an etching sacrificial layer selectively etched with respect to a silicon substrate is used to define an opening width of a liquid supply port on the front-surface side of the silicon substrate in Japanese Patent Laid-Open No. 2011-51253, there are cases where the etching sacrificial layer is less likely to be etched with an etchant having a high etching rate. Thus, there are cases where it is difficult to control the opening width through the use of the etching sacrificial layer.

SUMMARY OF THE INVENTION

Accordingly, aspects of the present invention provide a method for producing a liquid-discharge-head substrate by which formation of a liquid supply port can be performed in a short time from both surfaces of a silicon substrate and the liquid supply port can be formed so as to have an accurate opening width.

Aspects of the present invention provide a method for producing a liquid-discharge-head substrate including a liquid supply port extending through front and back surfaces of a silicon substrate, the method including a step of preparing a silicon substrate including, at a front-surface side of the silicon substrate, an energy generating element for discharging a liquid; a step of forming a first etchant introduction hole on the front-surface side of the silicon substrate; a step of supplying a first etchant into the first etchant introduction hole formed on the front-surface side of the silicon substrate, and supplying a second etchant to a back-surface side of the silicon substrate; a step of stopping the supply of the second etchant; and a step of, after the supply of the second etchant has been stopped, forming a liquid supply port extending through front and back surfaces of the silicon substrate by the supply of the first etchant.

Further features of the present invention will become apparent from the following description of exemplary embodiments with reference to the attached drawings.

DESCRIPTION OF THE EMBODIMENTS

Figure 3:
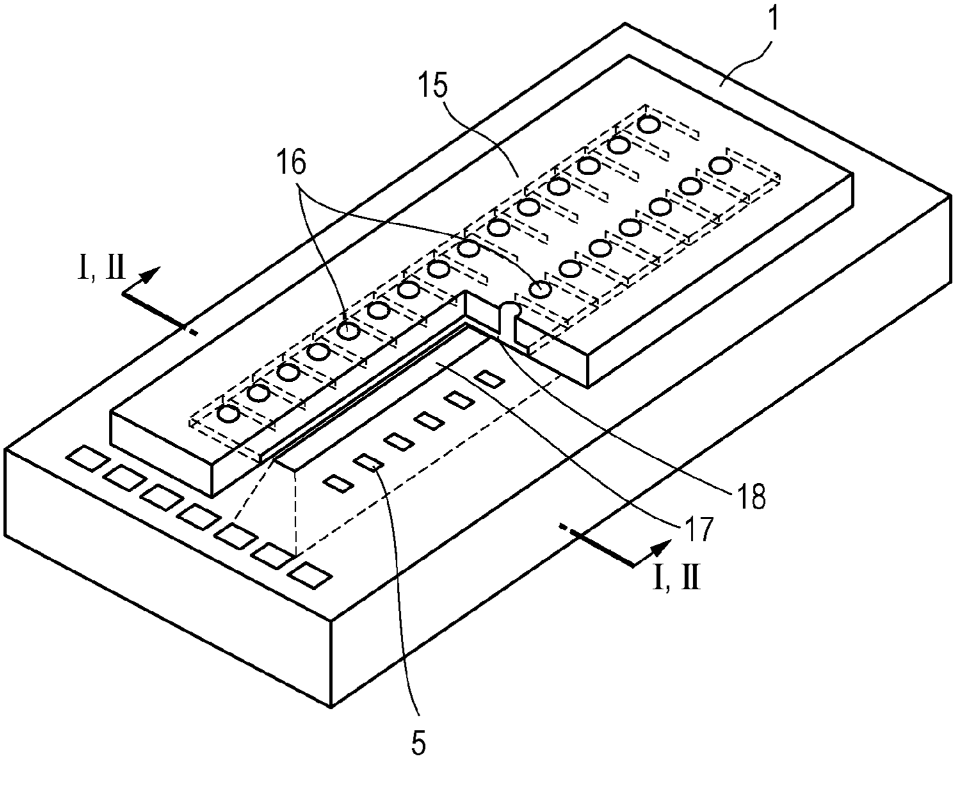
FIG. 3 is a schematic perspective view of a liquid-discharge head.

FIG. 3 is a schematic perspective view of a liquid-discharge head produced in accordance with an embodiment of the present invention. As illustrated in FIG. 3, the liquid-discharge head includes a silicon substrate 1 in which energy generating elements 5 are arranged at a predetermined pitch so as to form two columns. On the front-surface side of the silicon substrate 1, discharge orifices 16 are formed above a channel 18 and the energy generating elements 5, in a resin 15 forming a channel-forming member. A liquid supply port 17 is formed by anisotropically etching the silicon substrate 1 so as to extend through the front and back surfaces of the silicon substrate 1 and to open between the two columns of the energy generating elements 5. The liquid-discharge head is configured to perform recording in the following manner: a pressure generated by the energy generating elements 5 is applied to a liquid filling the liquid channel through the liquid supply port 17 so that the liquid (droplets) is discharged through the discharge orifices 16 onto a recording medium.

According to an embodiment of the present invention, different etchants are used for the front and back surfaces of a silicon substrate so that the surfaces are individually etched by etching operations having different functions. Specifically, an etchant that allows achievement of an accurate opening width is used for the front-surface side, whereas an etchant having a higher etching rate for the silicon substrate than the etchant used for the front-surface side is used for the back-surface side. As a result, the etching time can be reduced and the liquid supply port can be formed so as to have an accurate opening width on the front-surface side of the silicon substrate.

The inventors of the present invention have found that, when the etchant having a high etching rate reaches the front surface at the time of perforation of the liquid supply port through the silicon substrate, the reliability of energy generating elements and wiring of energy generating elements may be degraded. Accordingly, in aspects of the present invention, the etching from the back-surface side of the silicon substrate is stopped before the etching from the front-surface side of the silicon substrate is stopped.

According to an embodiment of the present invention, etching operations having different functions are individually performed and the etching from the back-surface side of the silicon substrate is stopped before the other etching is stopped. These features provide a synergistic effect so that the etching time can be reduced and the liquid supply port can be formed so as to have an accurate opening width on the front-surface side of the silicon substrate. In addition, the reliability of energy generating elements and wiring of energy generating elements that are formed on the front-surface side of the silicon substrate can be enhanced.

Hereinafter, embodiments of the present invention will be described.

A first embodiment will be described with reference to FIGS. 1A to 1G. FIGS. 1A to 1G are schematic sectional views taken along line I-I in FIG. 3. The discharge orifices and the channel illustrated in FIG. 3 are not shown in FIGS. 1A to 1G.

Figure 1A:
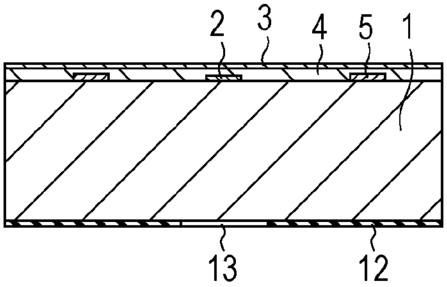
FIGS. 1A to 1G illustrate a method for producing a liquid-discharge-head substrate according to an embodiment of the present invention.

A silicon substrate illustrated in FIG. 1A is first prepared. The plurality of energy generating elements 5 and wiring for sending electric signals to the energy generating elements are disposed on the front-surface side of the silicon substrate 1. In addition, there are a protective layer 4 for protecting the energy generating elements and the wiring, a barrier layer (not shown) for forming a portion that electrically connects the liquid-discharge-head substrate and the recording apparatus main unit, a seed layer 3, an etching sacrificial layer 2 that is to be selectively etched with respect to the silicon substrate 1. The etching sacrificial layer 2 is formed of, for example, aluminum. On the back surface (an opposite surface with respect to the front surface) of the silicon substrate, an etching mask layer 12 is formed so as to have an opening 13 corresponding to the etching sacrificial layer 2 disposed on the front surface. The etching mask layer 12 is formed of a material that is less likely to be etched by an etchant to be used and examples of the material include silicon oxide and polyetheramide.

Figure 1B:
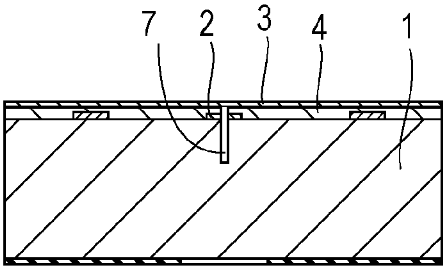
Figure 1C:
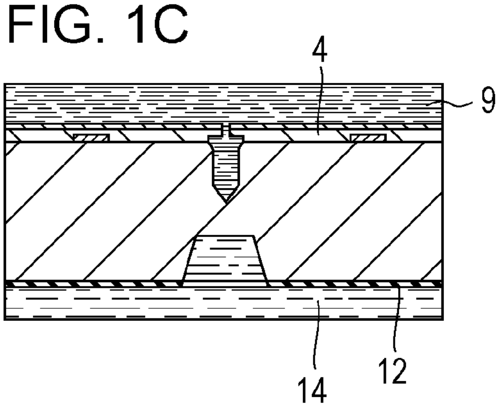

Referring to FIG. 1B, a first etchant introduction hole 7 is formed from above the seed layer 3 on the front surface so as to correspond to the opening of the liquid supply port and to extend through the seed layer 3, the barrier layer, the protective layer 4, and the etching sacrificial layer 2, but to remain within the silicon substrate 1. The first etchant introduction hole 7 is formed with, for example, laser. Referring to FIG. 1C, a first etchant 9 is used on the front-surface side and a second etchant 14 is used on the back-surface side so that these surfaces are individually etched.

The first etchant 9 can be an alkaline aqueous solution that has a lower etching rate for the protective layer 4 than for the silicon substrate 1, and has a higher etching rate for the etching sacrificial layer 2 than for the silicon substrate 1. In particular, the first etchant can be a TMAH aqueous solution. The TMAH concentration of the TMAH aqueous solution may be 15% by mass or more and 25% by mass or less, such as 22% by mass or less, and even 20% by mass or less. Thus, the silicon substrate 1 can be etched in a shorter time. In addition, since the etchant is less likely to etch the protective layer 4 present on the front-surface side of the silicon substrate 1, the opening width of the liquid supply port can be accurately controlled.

The second etchant 14 can be an etchant having a higher etching rate for the silicon substrate 1 than the first etchant 9. The second etchant can be a TMAH aqueous solution or a KOH aqueous solution. When a TMAH aqueous solution is used, the TMAH concentration of the TMAH aqueous solution can be 8% by mass or more and 15% by mass or less. When the TMAH concentration is 8% by mass or more, surface roughening of the silicon substrate can be suppressed. When the TMAH concentration is 15% by mass or less, the etching rate can be increased. When a TMAH aqueous solution has a TMAH concentration of 8% by mass or more and 15% by mass or less, for example, the TMAH aqueous solution can etch the silicon substrate at an etching rate 1.2 to 1.5 times the etching rate of a TMAH aqueous solution having a TMAH concentration of 22% by mass. To increase the etching rate for the silicon substrate 1, the TMAH concentration may be 10% by mass or less, such as 9% by mass or less. When a TMAH aqueous solution is used, cesium hydroxide (CsOH) can be added thereto. Addition of cesium hydroxide can also increase the etching rate for the silicon substrate 1. The second etchant can contain cesium hydroxide in an amount of 1% by mass or more and 5% by mass or less.

Figure 1D:
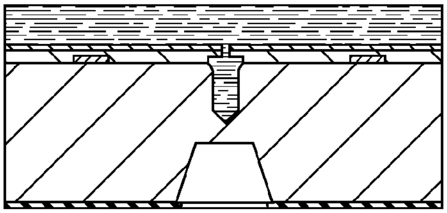
Figure 1E:
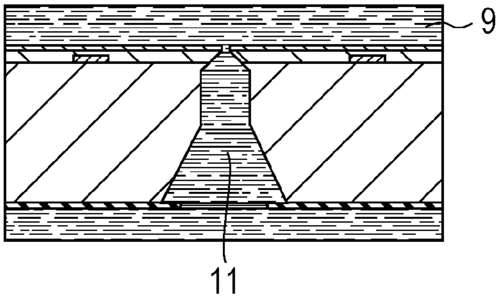
Figure 1F:
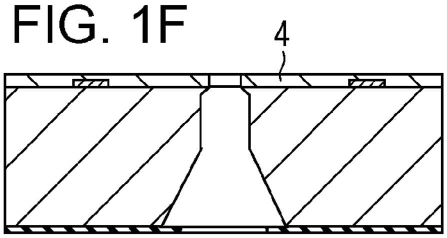
Figure 1G:
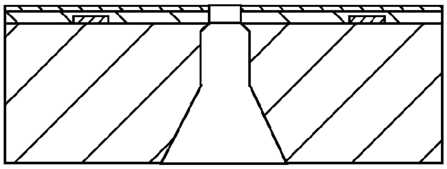

Referring to FIG. 1D, supply of the second etchant 14 is stopped before supply of the first etchant 9 is stopped. Referring to FIG. 1E, a liquid supply port 11 is formed by etching with the first etchant 9 so as to extend through the silicon substrate. Referring to FIG. 1F, portions of the seed layer 3, the barrier layer, and the protective layer 4 are then removed. Finally, referring to FIG. 1G, the etching mask layer 12 on the back surface is removed. When the above-described steps are performed, the etching time can be reduced and degradation of the reliability of the energy generating elements 5 and wiring of the energy generating elements 5 on the front surface can be suppressed. In the first embodiment, the opening only is formed in the etching mask layer on the back surface and the etching is performed. In the back surface, an etchant introduction hole may also be formed by, for example, laser processing as in the front surface.

A second embodiment will be described with reference to FIGS. 2A to 2F. FIGS. 2A to 2F are schematic sectional views taken along line II-II in FIG. 3. The discharge orifices and the channel illustrated in FIG. 3 are not shown in FIGS. 2A to 2F.

The second embodiment is the same as the first embodiment except that the etching mask layer is not formed on the back surface of the silicon substrate 1, second etchant introduction holes are formed in the back surface, and an etchant that has a lower etching rate for a silicon oxide film than for the silicon substrate 1 is used as the second etchant.

Figure 2A:
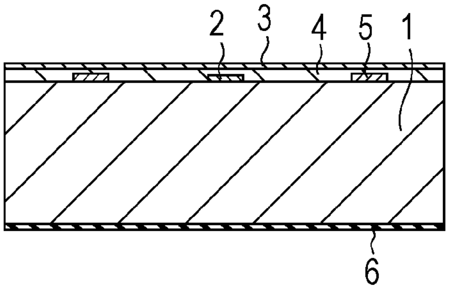
FIGS. 2A to 2F illustrate a method for producing a liquid-discharge-head substrate according to another embodiment of the present invention.

Referring to FIG. 2A, the front-surface side of the silicon substrate 1 has the same configuration as in the first embodiment. Although a silicon oxide film is formed on the back surface of the silicon substrate 1, it is not used as an etching mask layer. In particular, in the cases of silicon substrates for thermal ink-jet recording heads, a silicon oxide film is often formed on the back-surface side of the silicon substrate.

Figure 2B:
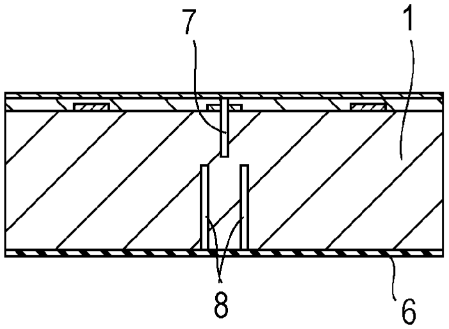
Figure 2C:
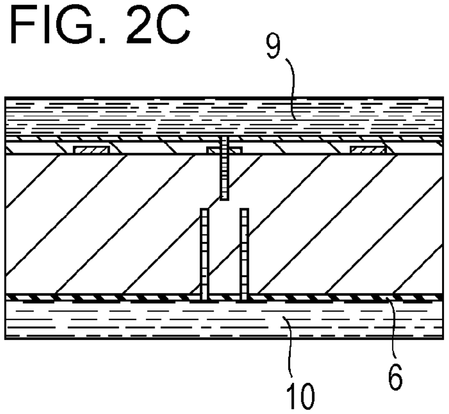

Referring to FIG. 2B, the first etchant introduction hole 7 is then formed on the front-surface side of the silicon substrate as in the first embodiment. On the back-surface side of the silicon substrate 1, second etchant introduction holes 8 are formed from above a silicon oxide film 6 so as to extend through the silicon oxide film 6 but to remain within the silicon substrate 1 and to correspond to the front-surface-side opening position of the liquid supply port. Referring to FIG. 2C, a first etchant 9 as in the first embodiment is used on the front-surface side and a second etchant 10 is used on the back-surface side so that these surfaces are individually etched. At this time, on the back-surface side of the silicon substrate 1, the silicon oxide film 6 and the silicon substrate 1 are simultaneously etched. The second etchant 10 is an etchant that has a higher etching rate for the silicon substrate 1 than the first etchant 9 and that also has a high etching rate for the silicon oxide film 6. Such an etchant is, for example, a KOH aqueous solution. When a KOH aqueous solution is used, the KOH concentration of this solution can be determined in accordance with the thickness of the silicon oxide film on the back surface such that the following relationship is satisfied: time for which the silicon oxide film on the back surface is removed<time over which supply of the second etchant is stopped. The KOH concentration can be 20% by mass or more and 50% by mass or less. The first etchant 9 may satisfy the conditions described in the first embodiment such as composition.

Figure 2D:
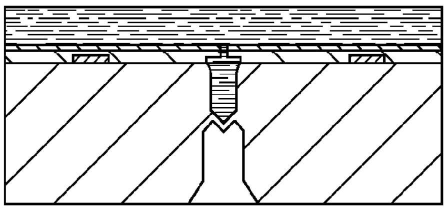
Figure 2E:
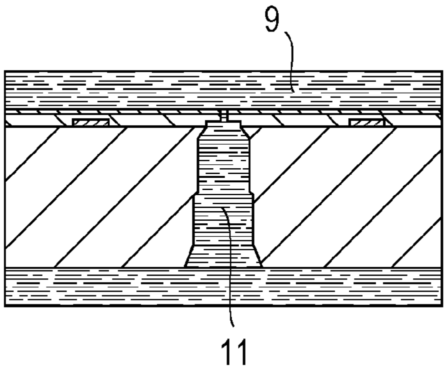
Figure 2F:
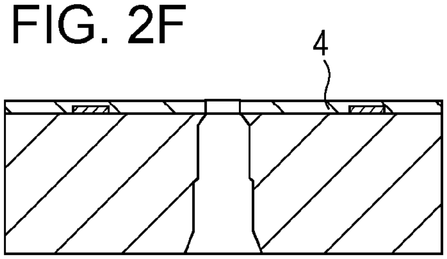

Referring to FIG. 2D, supply of the second etchant 10 to the back-surface side is then stopped before supply of the first etchant 9 to the front-surface side is stopped. Referring to FIG. 2E, a liquid supply port 11 is formed by etching with the first etchant 9 so as to extend through the silicon substrate. Referring to FIG. 2F, portions of the seed layer 3, the barrier layer, and the protective layer 4 are then removed. In the second embodiment, since the step of removing the silicon oxide film on the back surface can be eliminated, the etching time can be efficiently reduced. In addition, degradation of the reliability of the energy generating elements 5 and wiring of the energy generating elements 5 on the front surface can be suppressed.

EXAMPLES

Hereinafter, although the present invention will be described in detail with reference to examples, the present invention is not limited to the examples and may be embodied without departing from the spirit and scope thereof.

Example 1

Example 1 will be described with reference to FIGS. 1A to 1G.

Referring to FIG. 1A, a plurality of energy generating elements 5 were disposed on the front surface of a silicon substrate 1. The energy generating elements 5 were composed of TaSiN. An etching sacrificial layer 2 was then formed of aluminum on the front surface. A protective layer 4 was then formed so as to cover the energy generating elements 5 and the etching sacrificial layer 2. The protective layer 4 was composed of SiO. A barrier layer (not shown) used for forming a wiring portion that electrically connected the liquid-discharge head and the main unit, and a seed layer 3 were sequentially formed on the protective layer 4. The seed layer 3 was composed of gold. A silicon oxide film is formed on the back surface (an opposite surface with respect to the front surface) of the silicon substrate 1. In the silicon oxide film, an opening 13 was formed so as to correspond to the opening width of a liquid supply port. Thus, an etching mask layer 12 was formed.

Referring to FIG. 1B, a first etchant introduction hole 7 having a depth of 450 μm was formed by radiating laser from above the seed layer 3 on the front-surface side of the silicon substrate 1, so as to extend through the seed layer 3, the barrier layer, the protective layer 4, and the etching sacrificial layer 2, but to remain within the silicon substrate 1. Referring to FIG. 1C, etching of the front surface of the silicon substrate 1 with a first etchant 9 was initiated and etching of the back surface of the silicon substrate 1 with a second etchant 14 was initiated. These etching operations were simultaneously initiated. The first etchant 9 was a TMAH aqueous solution having 22% by mass of TMAH, the balance being pure water, in total, 100% by mass. The second etchant 14 was an aqueous solution having 10% by mass of TMAH and 1% by mass of CsOH, the balance being pure water, in total, 100% by mass.

Referring to FIG. 1D, before the etching hole formed from the first etchant introduction hole 7 on the front-surface side was brought into communication with the etching hole formed on the back-surface side, supply of the second etchant to the back-surface side was stopped to stop the etching on the back-surface side. The etching hole formed on the back-surface side was then rinsed with a rinse solution (pure water). Referring to FIG. 1E, the etching with the first etchant 9 was continued to bring the etching hole formed from the first etchant introduction hole 7 on the front-surface side into communication with the etching hole formed on the back-surface side. Thus, a liquid supply port 11 was formed. Referring to FIG. 1F, portions of the seed layer 3, the barrier layer, and the protective layer 4 were then removed. Finally, referring to FIG. 1G, the etching mask layer 12 was removed. In such a manner, ten liquid-discharge-head substrates were produced.

In Example 1, variations in the opening width of the liquid supply port were within ±1 μm and hence liquid-discharge-head substrates having high reliability were produced. The time over which the supply of the second etchant was stopped was 262 minutes. The time over which the liquid supply port was formed (etching time) was 288 minutes.

Example 2

Example 2 will be described with reference to FIGS. 2A to 2F.

Example 2 was the same as Example 1 except that the opening was not formed in the silicon oxide film on the back surface; the silicon oxide film was not used as the etching mask layer; second etchant introduction holes were formed on the back-surface side; and the composition of the second etchant was changed. The silicon oxide film on the back surface was made to have a thickness of 0.7 μm.

Referring to FIG. 2A, the front-surface configuration of the silicon substrate 1 was the same as in Example 1. A silicon oxide film 6 was formed on the back surface (an opposite surface with respect to the front surface) of the silicon substrate 1. Referring to FIG. 2B, a first etchant introduction hole 7 having a depth of 380 μm was then formed on the front-surface side of the silicon substrate 1.

Second etchant introduction holes 8 having a depth of 380 μm at a laser hole pitch of 410 μm were then formed by radiating laser from above the silicon oxide film 6 on the back surface so as to extend through the silicon oxide film 6 and to remain within the silicon substrate 1. Referring to FIG. 2C, etching on the front-surface side of the silicon substrate 1 with a first etchant 9 having the same composition as that in Example 1 was initiated and etching on the back-surface side of the silicon substrate 1 with a second etchant 10 having different composition from that in Example 1 was initiated. These etching operations for the surfaces were simultaneously initiated. On the back-surface side, the silicon oxide film 6 and the silicon substrate 1 were simultaneously etched. The second etchant 10 was a KOH aqueous solution having 23% by mass of KOH, the balance being pure water, in total, 100% by mass.

Referring to FIG. 2D, before the etching hole formed from the first etchant introduction hole 7 on the front-surface side was brought into communication with the etching hole formed on the back-surface side, supply of the second etchant 10 to the back-surface side was stopped to stop the etching on the back-surface side. The etching hole formed on the back-surface side was then rinsed with a rinse solution (pure water). Referring to FIG. 2E, the etching with the first etchant 9 was continued to bring the etching hole formed from the first etchant introduction hole 7 on the front-surface side into communication with the etching hole formed on the back-surface side. Thus, a liquid supply port 11 was formed. Finally, referring to FIG. 2F, portions of the seed layer 3, the barrier layer, and the protective layer 4 were removed. In such a manner, ten liquid-discharge-head substrates were produced.

In Example 2, variations in the opening width of the liquid supply port were within ±1 μm and hence liquid-discharge-head substrates having high reliability were produced. The time over which the silicon oxide film on the back surface was removed was 74 minutes. The time over which the supply of the second etchant was stopped was 78 minutes. The time over which the liquid supply port was formed (etching time) was 159 minutes.

Example 3

Liquid-discharge-head substrates were produced as in Example 1 except that the first etchant was a TMAH aqueous solution having 15% by mass of TMAH, the balance being pure water, in total, 100% by mass.

In Example 3, variations in the opening width of the liquid supply port were within ±1 μm and hence liquid-discharge-head substrates having high reliability were produced. The time over which the supply of the second etchant was stopped was 256 minutes. The time over which the liquid supply port was formed (etching time) was 281 minutes.

Example 4

Liquid-discharge-head substrates were produced as in Example 1 except that the first etchant was a TMAH aqueous solution having 25% by mass of TMAH, the balance being pure water, in total, 100% by mass.

In Example 4, variations in the opening width of the liquid supply port were within ±1 μm and hence liquid-discharge-head substrates having high reliability were produced. The time over which the supply of the second etchant was stopped was 264 minutes. The time over which the liquid supply port was formed (etching time) was 291 minutes.

Example 5

Liquid-discharge-head substrates were produced as in Example 2 except that the first etchant was a TMAH aqueous solution having 15% by mass of TMAH, the balance being pure water, in total, 100% by mass.

In Example 5, variations in the opening width of the liquid supply port were within ±1 μm and hence liquid-discharge-head substrates having high reliability were produced. The time over which the silicon oxide film on the back surface was removed was 74 minutes. The time over which the supply of the second etchant was stopped was 97 minutes. The time over which the liquid supply port was formed (etching time) was 154 minutes.

Example 6

Liquid-discharge-head substrates were produced as in Example 2 except that the first etchant was a TMAH aqueous solution having 25% by mass of TMAH, the balance being pure water, in total, 100% by mass.

In Example 6, variations in the opening width of the liquid supply port were within ±1 μm and hence liquid-discharge-head substrates having high reliability were produced. The time over which the silicon oxide film on the back surface was removed was 74 minutes. The time over which the supply of the second etchant was stopped was 80 minutes. The time over which the liquid supply port was formed (etching time) was 160 minutes.

Example 7

Liquid-discharge-head substrates were produced as in Example 1 except that the second etchant was a TMAH aqueous solution having 8% by mass of TMAH and 1% by mass of CsOH, the balance being pure water, in total, 100% by mass.

In Example 7, variations in the opening width of the liquid supply port were within ±1 μm and hence liquid-discharge-head substrates having high reliability were produced. The time over which the supply of the second etchant was stopped was 260 minutes. The time over which the liquid supply port was formed (etching time) was 286 minutes.

Example 8

Liquid-discharge-head substrates were produced as in Example 1 except that the second etchant was a TMAH aqueous solution having 8% by mass of TMAH and 5% by mass of CsOH, the balance being pure water, in total, 100% by mass.

In Example 8, variations in the opening width of the liquid supply port were within ±1 μm and hence liquid-discharge-head substrates having high reliability were produced. The time over which the supply of the second etchant was stopped was 228 minutes. The time over which the liquid supply port was formed (etching time) was 250 minutes.

Example 9

Liquid-discharge-head substrates were produced as in Example 1 except that the second etchant was a TMAH aqueous solution having 15% by mass of TMAH and 1% by mass of CsOH, the balance being pure water, in total, 100% by mass.

In Example 9, variations in the opening width of the liquid supply port were within ±1 μm and hence liquid-discharge-head substrates having high reliability were produced. The time over which the supply of the second etchant was stopped was 298 minutes. The time over which the liquid supply port was formed (etching time) was 328 minutes.

Example 10

Liquid-discharge-head substrates were produced as in Example 1 except that the second etchant was a TMAH aqueous solution having 15% by mass of TMAH and 5% by mass of CsOH, the balance being pure water, in total, 100% by mass.

In Example 10, variations in the opening width of the liquid supply port were within ±1 μm and hence liquid-discharge-head substrates having high reliability were produced. The time over which the supply of the second etchant was stopped was 291 minutes. The time over which the liquid supply port was formed (etching time) was 320 minutes.

Example 11

Liquid-discharge-head substrates were produced as in Example 2 except that the silicon oxide film on the back surface was made to have a thickness of 1.1 μm and the second etchant was a KOH aqueous solution having 48% by mass of KOH, the balance being pure water, in total, 100% by mass.

In Example 11, variations in the opening width of the liquid supply port were within ±1 μm and hence liquid-discharge-head substrates having high reliability were produced. The time over which the silicon oxide film on the back surface was removed was 39 minutes. The time over which the supply of the second etchant was stopped was 40 minutes. The time over which the liquid supply port was formed (etching time) was 81 minutes.

Comparative Example 1

Liquid-discharge-head substrates were produced as in Example 1 except that the second etchant was a TMAH aqueous solution having 22% by mass of TMAH, the balance being pure water, in total, 100% by mass: that is, the first and second etchants had the same composition.

In Comparative example 1, variations in the opening width of the liquid supply port were within ±1 μm. The time over which the supply of the second etchant was stopped was 488 minutes. The time over which the liquid supply port was formed (etching time) was 536 minutes.

Although the variations in the opening width of the liquid supply port were small, the production time was longer than that in Example 1. In addition, etching needed to be performed beyond the allowable overetching time and the opening width of the supply port on the front-surface side became large.

Comparative Example 2

Liquid-discharge-head substrates were produced as in Example 2 except that the first etchant was a KOH aqueous solution having 23% by mass of KOH, the balance being pure water, in total, 100% by mass: that is, the first and second etchants had the same composition.

In liquid-discharge-head substrates produced in Comparative example 2, the protective layer 4 that defined the opening width was etched and variations in the opening width of the liquid supply port were ±10 μm or more. The time over which the silicon oxide film on the back surface was removed was 74 minutes. The time over which the supply of the second etchant was stopped was 66 minutes. The time over which the liquid supply port was formed (etching time) was 132 minutes.

Comparative Example 3

Liquid-discharge-head substrates were produced as in Example 2 except that supply of the second etchant 10 to the back-surface side was not stopped before the etching hole formed from the first etchant introduction hole 7 on the front-surface side was brought into communication with the etching hole formed on the back-surface side. That is, before supply of the second etchant 10 was stopped, a liquid supply port extending through the front and back surfaces of the silicon substrate was formed.

In the production of liquid-discharge-head substrates in Comparative example 3, the KOH aqueous solution reached the front surface as in Comparative example 2. As a result, the protective layer 4 was etched and variations in the opening width of the liquid supply port were ±10 μm or more. The time over which the oxide film on the back surface was removed was 74 minutes. The time over which the supply of the second etchant was stopped was 79 minutes. The time over which the liquid supply port was formed (etching time) was 159 minutes.

Aspects of the present invention can provide a method for producing a liquid-discharge-head substrate by which a liquid supply port can be formed from both surfaces of the silicon substrate in a short time so as to have an accurate opening width.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-137731 filed Jun. 21, 2011 and No. 2012-112719 filed May 16, 2012, which are hereby incorporated by reference herein in their entirety.

What is claimed is:

1. A method for producing a liquid-discharge-head substrate including a liquid supply port extending through front and back surfaces of a silicon substrate, the method comprising:

a step of preparing a silicon substrate including, at a front-surface side of the silicon substrate, an energy generating element for discharging a liquid;

a step of supplying a first etchant to a front-surface side of the silicon substrate, and supplying a second etchant to a back-surface side of the silicon substrate;

a step of stopping the supply of the second etchant; and a step of, after the supply of the second etchant has been stopped, forming a liquid supply port extending through front and back surfaces of the silicon substrate by the supply of the first etchant, wherein the silicon substrate includes a protective layer and an etching sacrificial layer on the front-surface side of the silicon substrate;

wherein the first etchant has a lower etching rate for the protective layer than for the silicon substrate and has a higher etching rate for the etching sacrificial layer than for the silicon substrate; and wherein the second etchant has a higher etching rate for the silicon substrate than the first etchant.

2. The method according to claim 1, wherein the step of forming a first etchant introduction hole on the front surface side of the substrate is performed before the step of supplying the first etchant is performed, and the first etchant is supplied to the first etchant introduction hole in the step of supplying the first etchant.

3. The method according to claim 1, wherein the first etchant is a tetramethyl ammonium hydroxide (TMAH) aqueous solution and the second etchant is a TMAH aqueous solution or a KOH aqueous solution.

4. The method according to claim 1, wherein the first etchant is a TMAH aqueous solution having a TMAH concentration of 15% by mass or more and 25% by mass or less; the second etchant is a TMAH aqueous solution having a TMAH concentration of 8% by mass or more and 15% by mass or less or a KOH aqueous solution having a KOH concentration of 20% by mass or more and 50% by mass or less.

5. The method according to claim 3, wherein the second etchant contains cesium hydroxide at a concentration of 1% by mass or more and 5% by mass or less.

* * * * *